United States Patent
Beitelmal et al.

(10) Patent No.: US 7,218,996 B1
(45) Date of Patent: May 15, 2007

(54) METHOD FOR THERMALLY MANAGING A ROOM

(75) Inventors: Abdlmonem H. Beitelmal, Los Altos, CA (US); Cullen E. Bash, Los Gatos, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/474,765

(22) Filed: Jun. 26, 2006

(51) Int. Cl.
*G06F 19/00* (2006.01)

(52) U.S. Cl. .................. 700/276; 700/291; 312/265.1; 165/80.3

(58) Field of Classification Search ................ 700/276, 700/277, 291; 312/265.1; 165/80.3; 454/184; 361/690
See application file for complete search history.

(56) References Cited

U.S. PATENT DOCUMENTS 6,164,369 A * 12/2000 Stoller .................. 165/104.33

2005/0023363 A1* 2/2005 Sharma et al. ............. 236/49.3

OTHER PUBLICATIONS

Sharma et al., Hewlett-Pckard Compay, Balance of power:Dynamic Thermal Management for Internet Data Centers, Feb. 18, 2003, p. 1-13.*

VanGilder et al., Airflow Uniformiltythough perforated tiles in a raised-Floor Data Cente, APC and IBM for the ASME Inter PAK 2005 Conference, Jul. 17-22, p. 1-9.*

* cited by examiner

*Primary Examiner*—Kidest Bahta
(74) *Attorney, Agent, or Firm*—Richard P. Lange

(57) ABSTRACT

In a method for thermally managing a room with at least one air moving device having a temperature actuator and an airflow rate actuator, a temperature of airflow at a first location in the room is received and compared with a first predetermined temperature range and a second predetermined temperature range. In the method, one of the temperature actuator and the airflow rate actuator is varied when the received temperature of the airflow is outside of the first predetermined temperature range and the other of the temperature actuator and the airflow rate actuator is varied when the received temperature of the airflow is within the first predetermined temperature range and outside of the second predetermined temperature range.

20 Claims, 6 Drawing Sheets

METHOD FOR THERMALLY MANAGING A ROOM

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation.

Air conditioning units are typically used to cool heated air and to supply the cooled air to the computer systems. The cooled air is typically supplied through a series of vent tiles positioned above a plenum that directs airflow from the air conditioning units to the vent tiles. Conventional cooling systems are typically provisioned and operated for worst-case or peak load scenarios. Since it is estimated that typical data center operations only utilize a fraction of their computer systems, provisioning for these types of scenarios often increases the inefficiencies found in conventional cooling systems.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein is a system and method for thermally managing a room with at least one air moving device. The system and method disclosed herein may be employed to thermally manage the room such that airflow having predetermined characteristics, such as, temperature and flow rate, is supplied as desired in the room, while substantially minimizing the amount of energy required to supply the airflow. The energy usage is substantially minimized, for instance, by substantially restricting increased operations of the air moving device actuators associated with higher costs to situations where detected temperatures exceed a first predetermined temperature level. In addition, other air moving device actuators associated with lower costs are varied where the detected temperatures fall below the first predetermined temperature level, but exceed a second predetermined temperature level. In this regard, for instance, the air moving device actuators requiring greater amounts of energy are used when there is a greater need for lower temperatures. The type of air moving device generally determines which of the air moving device actuators is associated with higher costs. However, the costs associated with the air moving device actuators may also be determined through testing.

Figure 1:
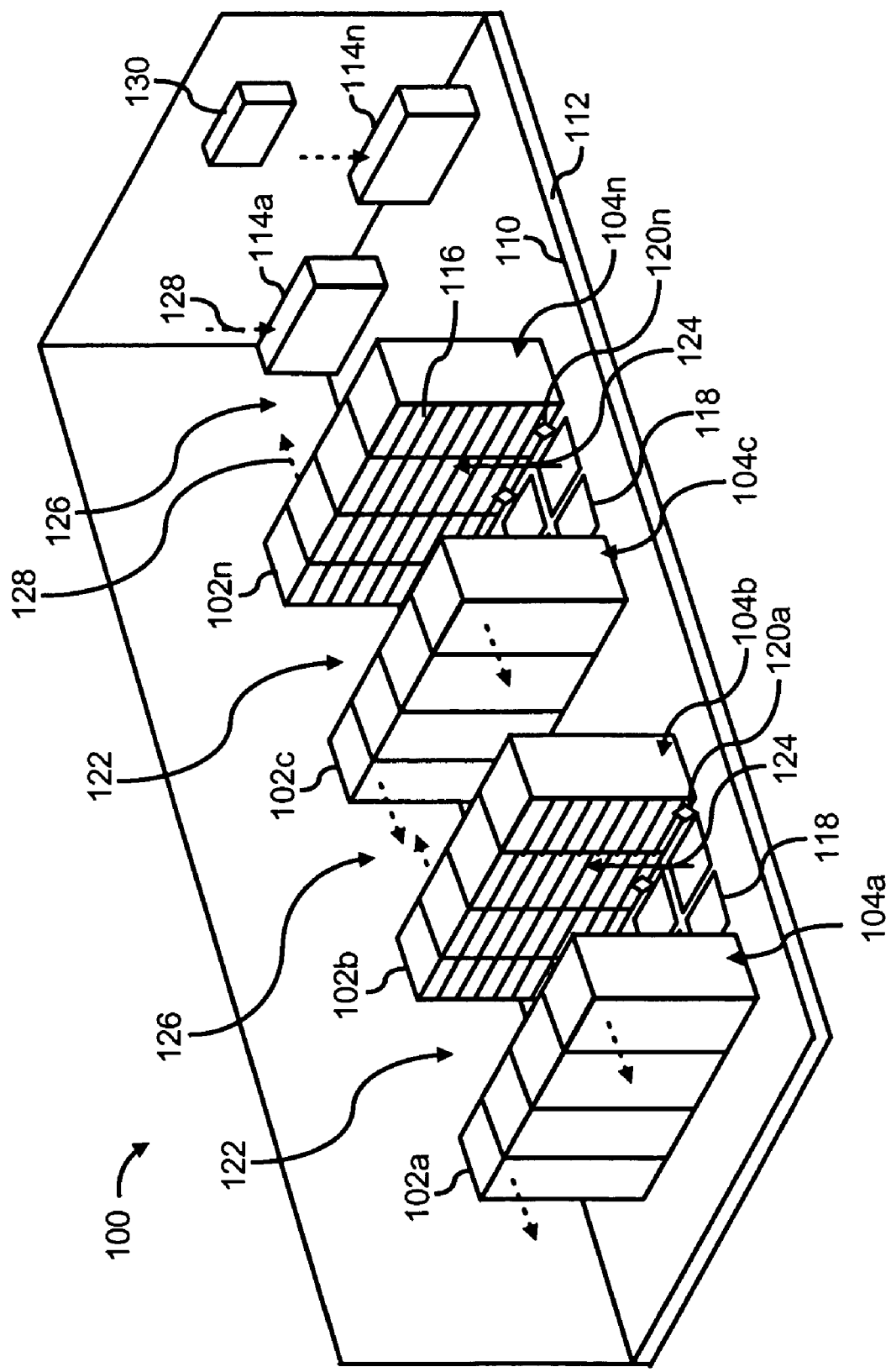
FIG. 1 shows a simplified perspective view of a section of a data center, according to an embodiment of the invention.

With reference first to FIG. 1, there is shown a simplified perspective view of a section of a data center 100 which may employ various examples of a system for thermal management of the data center 100 disclosed herein. The terms "data center" are generally meant to denote a room or other space where one or more components capable of generating heat may be situated. In this respect, the terms "data center" are not meant to limit embodiments of the invention to any specific type of room where data is communicated or processed, nor should it be construed that use of the terms "data center" limits the invention in any respect other than its definition herein above.

The data center 100 is depicted as having a plurality of racks 102a–102n, where "n" is an integer greater than one. The racks 102a–102n may comprise, for instance, electronics cabinets configured to house electronic components 116, for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like.

The racks 102a–102n are depicted as being positioned on a raised floor 110, which may function as a plenum for delivery of cooled air from one or more air moving devices 114a–114n. The air moving devices 114a–114n, where "n" is an integer greater than one, generally operate to supply airflow into a space 112 beneath a raised floor 110, and in certain instances to cool heated air (indicated by the arrows 128). In addition, the air moving devices 114a–114n may supply the electronic components 116 housed in the racks 102a–102n with airflow that has been cooled, through any reasonably suitable known manners and may thus comprise widely available, conventional air conditioning (AC) units. For instance, the air moving devices 114a–114n may comprise vapor-compression type air conditioning units, chiller type air conditioning units, etc. Examples of suitable air moving devices 114a–114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

The air moving devices 114a–114n include respective actuators (not shown) configured to manipulate characteristics of the cooled airflow supplied to the racks 102a–102n, such as airflow temperature and supply rate. As such, the actuators include, for instance, devices for manipulating airflow temperature, such as chillers, heat exchangers, etc., and devices for manipulating the supply flow rates, such as variable frequency devices, blowers, etc., of the cooled air. The cooled air, indicated by the arrows 124, may be delivered from the space 112 to the racks 102a–102n through air delivery devices 118 located between some or all of the racks 102a–102n. The air delivery devices 118 may comprise, for instance, ventilation tiles, variable airflow volume devices, etc., and are shown as being located between rows 104a and 104b and 104c and 104d. Although the air delivery devices 118 and the space 112 have been depicted as being located on a floor of the data center 100, it should be understood that the air delivery devices 118 and the space 112 may be positioned on the ceiling or a wall of the data center 100 without departing from a scope of the invention.

In any regard, the cooled air contained in the space 112 may include cooled air supplied by one or more air moving devices 114a–114n. Thus, characteristics of the cooled air, such as, temperature, pressure, humidity, flow rate, etc., may substantially be affected by the operations of a plurality of the air moving devices 114a–114n. In this regard, characteristics of the cooled air at various areas in the space 112 and the cooled air supplied to the racks 102a–102n may vary, for instance, due to mixing of the cooled air. In other words, the characteristics of the cooled air supplied to a particular location in the data center 100 may differ from that of the cooled air supplied by a single air moving device 114a. In addition, the characteristics of the cooled air supplied through the air delivery devices 118 are affected by the characteristics of air flowing through the other air delivery devices 118.

As described in greater detail herein below, various techniques are employed to control the air moving devices 114a–114n to achieve pre-specified thermal management objectives as well as to substantially minimize the energy required to adequately cool the electronic components 116. In one regard, the air moving devices 114a–114n are operated to substantially maintain the temperatures of airflow supplied through the air delivery devices 118 below predefined maximum levels and above predefined minimum levels to thereby achieve the pre-specified thermal management objectives. The temperatures at various locations throughout the data center 100 may be detected by sensors 120a–120n, which are represented as diamonds to distinguish them from other elements depicted in FIG. 1. The sensors 120a–120n may comprise sensors configured to detect at least one environmental condition, such as, mass flow rates of air supplied through the air delivery devices, velocities of air supplied through the air delivery devices, airflow temperature, absolute humidity, or pressure.

The sensors 120a–120n are depicted as being positioned to detect the at least one environmental condition at the inlets of some of the racks 102a–102n. The sensors 120a–120n may, however, be positioned at various other locations, such as, within the racks 102a–102n. In one example, the sensors 120a–120n may comprise sensors 120a–120n associated with or integrally manufactured with one or more of the electronic components 116.

The actuators for manipulating airflow temperature and for manipulating airflow supply rate of the air moving devices 114a–114n may be operated based upon the temperature measurements obtained by the sensors 120a–120n. More particularly, in one example, the actuators for manipulating airflow supply rate may be controlled to vary the airflow supply rates when the temperatures are outside of a second predetermined temperature range, but inside of a first predetermined temperature range, and the actuators for manipulating airflow temperature may be controlled to vary the airflow temperature when the temperatures are outside of the first predetermined temperature range. In another example, the temperature actuators may be controlled to vary the temperature when the temperatures are outside of the second predetermined temperature range, but inside of the first predetermined temperature range, and the airflow rate actuators may be controlled to vary the airflow temperature when the detected temperatures are outside of the first predetermined temperature range. The selection of which actuator to employ may be based upon the costs associated with actuator operation. More particularly, the actuator associated with higher costs may be varied when the detected temperatures are outside of the first predetermined temperature range. By operating the air moving devices 114a–114n in this manner, the amount of energy required to thermally manage the electronic components 116 may substantially be minimized.

The air moving devices 114a–114n may be controlled by a controller 130, which is configured to perform various functions in the data center 100. Some of the functions of the controller 130 are described in greater detail herein below. Although the controller 130 is illustrated in FIG. 1 as comprising a component separate from the components 116 housed in the racks 102a–102n, the controller 130 may comprise one or more of the components 116 without departing from a scope of the data center 100 disclosed herein. In addition, or alternatively, the controller 130 may comprise software configured to operate on a computing device, for instance, one of the components 116.

Figure 2:
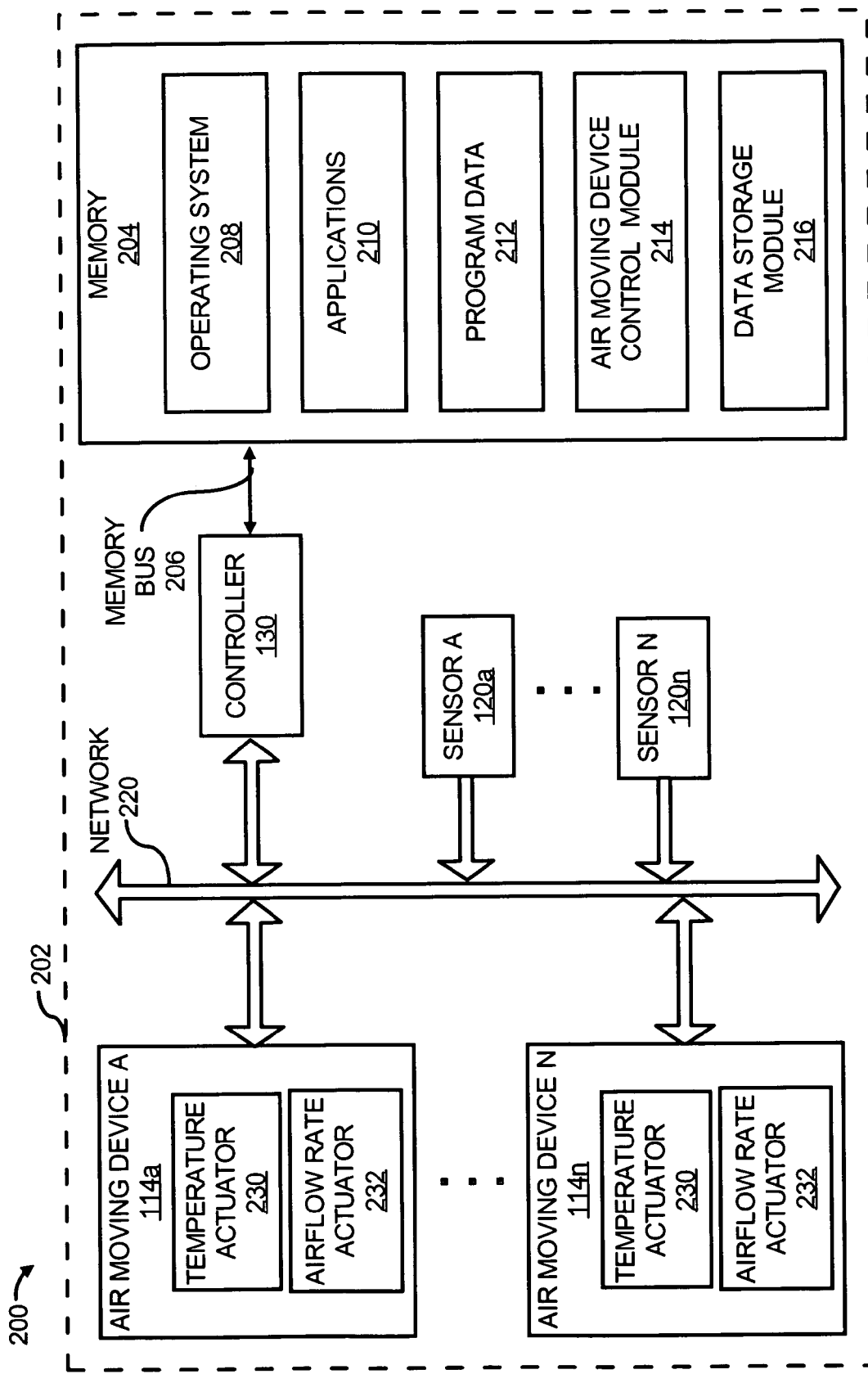
FIG. 2 is a block diagram of system for thermally management of a data center, according to an embodiment of the invention.

Turning now to FIG. 2, there is shown a block diagram 200 of a system 202 for thermal management of a data center, according to an example. It should be understood that the following description of the block diagram 200 is but one manner of a variety of different manners in which such a thermal management system 202 may be configured. In addition, it should be understood that the thermal management system 202 may include additional components and that some of the components described herein may be removed and/or modified without departing from a scope of the thermal management system 202. For instance, the thermal management system 202 may include any number of sensors, memories, processors, air moving devices, vent tiles, etc., as well as other components, which may be implemented in the operations of the thermal management system 202.

As shown, the thermal management system 202 includes the controller 130 depicted in FIG. 1, which may comprise any of the computing devices described above. The controller 130 may moreover comprise a microprocessor, a microcontroller, an application specific integrated circuit (ASIC), and the like, configured to perform various processing functions. In addition, or alternatively, the controller 130 may comprise software operating in any of a number of computing devices.

The controller 130 is illustrated as being in communication with a memory 204 through a memory bus 206. However, in various instances, the memory 204 may form part of the controller 130 without departing from a scope of the thermal management system 202. Generally speaking, the memory 204 may be configured to provide storage of software, algorithms, and the like, that provide the functionality of the controller 130. By way of example, the memory 204 may store an operating system 208, application programs 210, program data 212, and the like. In this regard, the memory 204 may be implemented as a combination of volatile and non-volatile memory, such as DRAM, EEPROM, MRAM, flash memory, and the like. In addition, or alternatively, the memory 204 may comprise a device configured to read from and write to a removable media, such as, a floppy disk, a CD-ROM, a DVD-ROM, or other optical or magnetic media.

The memory 204 may also store an air moving device control module 214. Generally speaking, the controller 130 may invoke the air moving device control module 214 to manipulate operations of the air moving devices 114a–114n as part of an operation to thermally manage the data center 100. More particularly, the controller 130 may receive input, such as, at least one environmental condition, from the sensors 120a–120n over a network 220 and may enter that input into the air moving device control module 214. The air moving device control module 214 may use that input to determine which of the air moving devices 114a–114n to manipulate and also to determine how the air moving devices 114a–114n are to be manipulated.

The data collected from the sensors 120a–120n may be stored in a data storage module 216 of the memory 204. The data storage module 216 may store additional information pertaining to operations of the air moving device control module 214. The additional information may include, for instance, the maximum rated capacities of the air moving devices 114a–114n, the zones of the data center 100 to which the air moving devices 114a–114n are associated, the levels to which the air moving devices 114a–114n are to be manipulated, etc.

A particular zone of the data center 100 may be defined, for instance, as an area in the data center 100 to which a particular air moving device 114a–114n has a predetermined level of influence. The predetermined level of influence may be set according to, for instance, various design considerations as well as the level of cooling required from the air moving devices 114a–114n.

In a first example, the zone for a particular air moving device 114a may be defined as a particular distance from the air moving device 114a. In this example, the zones for each of the air moving devices 114a–114n may be defined by an equation that defines a predetermined radius around each of the air moving devices 114a–114n. The sizes of the zones for each of the air moving devices 114a–114n may be similar to each other or they may differ from one another. The zone sizes may differ for one or more of the air moving devices 114a–114n, for instance, in situations where one or more of the air moving devices 114a–114n have differing capacities with respect to each other.

In a second example, the zone for a particular air moving device 114a may be determined through a commissioning process that correlates various sensor 120a–120n locations with the air moving devices 114a–114n. An example of a suitable commissioning process is disclosed in co-pending and commonly assigned U.S. patent application Ser. No. 11/078,087, entitled "Commissioning of Sensors", filed on Mar. 11, 2005, the disclosure of which is hereby incorporated by reference in its entirety. According to this example, the zones for the air moving devices 114a–114n may include those areas where air moving devices 114a–114n have a predetermined level of influence as detected by the one or more of the sensors 120a–120n. These areas may be determined through iterative testing as discussed in the Ser. No. 11/078,087 application for patent.

In any of the examples above, the zones may overlap for one or more of the air moving devices 114a–114n or the zones may be associated with respective air moving devices 114a–114n. As described in greater detail herein below, the controller 130 may control the air moving devices 114a–114n to vary one or both of the temperature and the flow rate of airflow supplied to the respective zones. More particularly, the controller 130 may control temperature actuators 230 to control the temperatures of airflow supplied by the air moving devices 114a–114n. In addition, the controller 130 may control airflow rate actuators 232 to control the rates at which airflow is supplied by the air moving devices 114a–114n. The controller 130 may control the temperature actuators 230 and the airflow rate actuators 232 through transmission of control signals over the network 220, which represents a wired or wireless structure in the data center 100 for the transmission of data between the various components of the thermal management system 202. The network 220 may comprise an existing network infrastructure or it may comprise a separate network configuration installed for the purpose of thermal management by the controller 130.

The airflow rate actuators 232 may comprise variable frequency drives (VFD) for controlling an airflow volume varying device, such as a blower or fan. In addition, the temperature actuators 230 may comprise devices for controlling the temperature of the cooled air supplied by the air moving devices 114a–114n. Thus, the temperature actuators 230 may depend upon the type of air moving devices 114a–114n in which the temperature actuators 230 are situated.

More particularly, for instance, if an air moving device 114a comprises a vapor-compression type air conditioning unit, the temperature actuator 230 may comprise a variable speed compressor configured to vary the temperature of the airflow supplied by the air conditioning unit. If the air moving device 114a comprises a chiller-type air conditioning unit, the temperature actuator 230 may comprise a two or three-way valve configured to control the temperature of a coolant configured to receive heat from the airflow.

Figure 3:
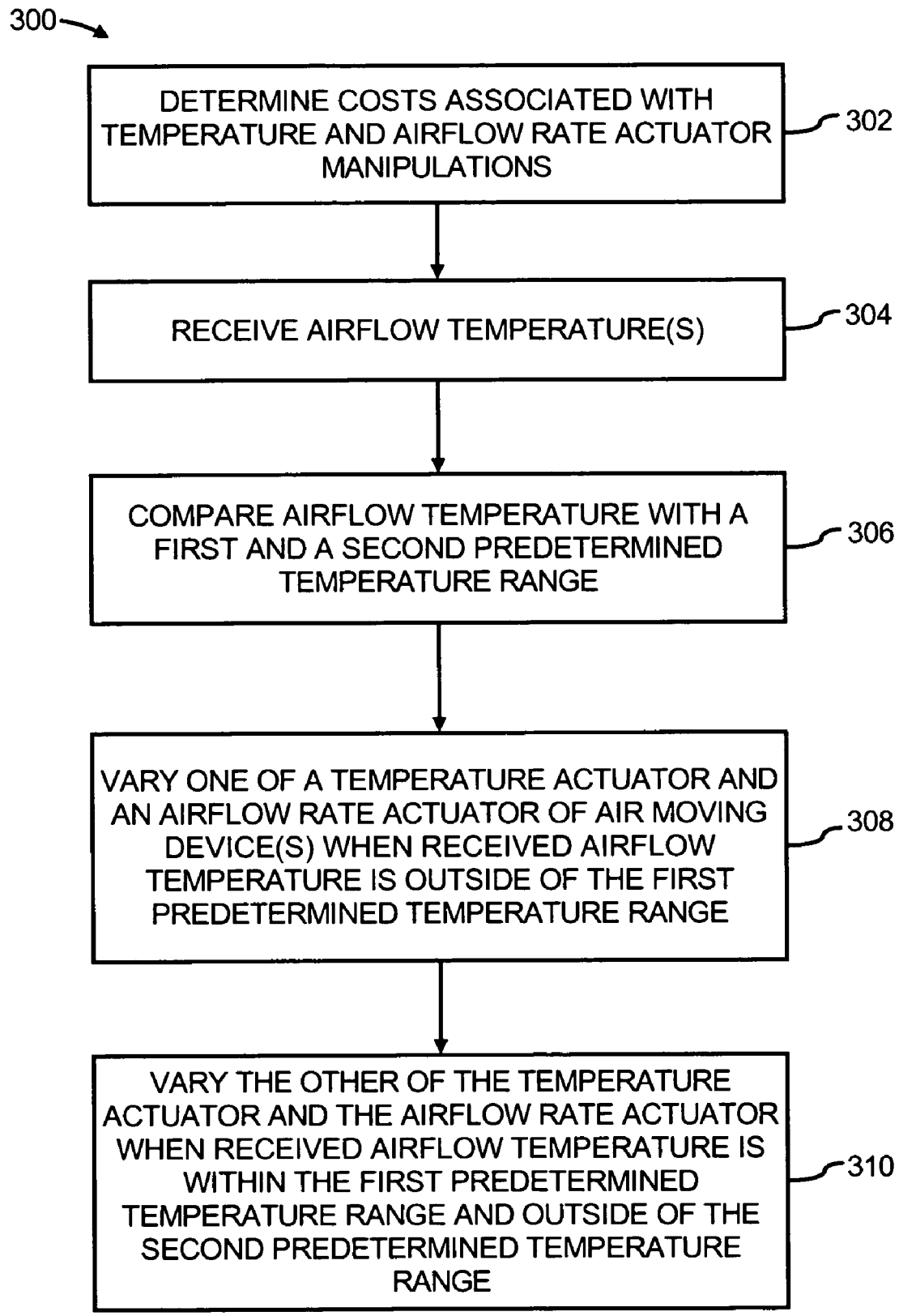
FIG. 3 illustrates a flow diagram of a method for thermally managing a room, according to an embodiment of the invention.

Turning now to FIG. 3, there is shown a flow diagram of a method 300 for thermally managing a room, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

Generally speaking, the method 300 may be implemented to substantially independently control both the temperature and the flow rate of airflow supplied to various areas in the data center 100 by one or more air moving devices 114a–114n. More particularly, the method 300 may be implemented to substantially independently control the temperature and the flow rate of the airflow depending upon the levels to which detected temperatures deviate from a first and a second predetermined temperature range to thereby substantially minimize the energy consumption requirements of the one or more air moving devices 114a–114n. That is, for instance, the actuator associated with the higher costs may be varied when a greater temperature deviation is detected and the actuator associated with the lower costs may be varied when a lesser temperature deviation is detected, to thereby substantially minimize the energy consumption levels of the one or more air moving devices 114a–114n.

The description of the method 300 is made with reference to the block diagram 200 illustrated in FIG. 2, and thus makes reference to the elements cited therein. It should, however, be understood that the method 300 is not limited to the elements set forth in the block diagram 300. Instead, it should be understood that the method 300 may be practiced by a thermal management system having a different configuration than that set forth in the block diagram 200.

At step 302, the costs associated with manipulating the temperature actuators 230 and with manipulating the airflow rate actuators 232 may optionally be determined. Step 302 is considered as being optional because information pertaining to the costs associated with the temperature actuators 230 and the airflow rate actuators 232 may have previously been determined and stored in the memory 204. In any regard, the costs may be determined by a user or the controller 130 may automatically determine the costs through, for instance, power measurements.

At step 304, the controller 130 may receive airflow temperatures detected by one or more sensors 120a–120n, as described above. The controller 130 may compare the received airflow temperature(s) with a first and a second predetermined temperature range at step 306. The first predetermined temperature range encompasses a broader temperature range as compared with the second predetermined temperature range. As such, the second predetermined temperature range may be considered as being encompassed within the first predetermined temperature range. In addition, the first and the second predetermine temperature ranges may be selected according to various criteria. The criteria may include, for instance, recommended operating temperatures for the electronic components 116, desired levels of energy usage in thermally managing the data center 100, configuration of the data center 100, the locations of the sensors 120a–120n with respect to the one or more air moving devices 114a–114n, etc. In addition, an upper bound of the first predetermined temperature range may be equivalent the second predetermined range plus a first pre-specified value and a lower bound of the first predetermined temperature range may be equivalent to the second predetermined range minus a second pre-specified value. The first and the second pre-specified values may or may not be equivalent to each other.

At step 308, the controller 130 may control the one or more air moving devices 114a–114n to vary one of a temperature actuator 230 and an airflow rate actuator 232 to vary the temperature or flow rate of the airflow supplied to a location around the one or more sensors 120a–120n that detected the received temperature when the received temperature is outside of the first predetermined temperature range.

At step 310, the controller 130 may control the one or more air moving devices 114a–114n to vary the other of the temperature actuator 230 and the airflow rate actuator 232 to vary the temperature or flow rate of airflow supplied to a location around the one or more sensors 120a–120n that detected the received temperature when the received temperature is within the first predetermined temperature range and outside of the second predetermined temperature range.

A more detailed description of the steps outlined in the method 300 is provided below with respect to the methods 400 and 450, respectively depicted in FIGS. 4A and 4B. The flow diagrams of the methods 400 and 450 are similar to the method 300, but include more detailed steps. More particularly, for instance, the method 400 may be employed for air moving devices 114a–114n having operations where temperature actuator 230 manipulations are associated with higher costs. In addition, the method 450 may be employed for air moving devices 114a–114n having operations where the airflow rate actuator 232 manipulations are associated with higher costs.

It is to be understood that the following description of the methods 400 and 450 are but two manners of a variety of different manners in which an example of the invention may be practiced. It should also be apparent to those of ordinary skill in the art that the methods 400 and 450 represent generalized illustrations and that other steps may be added or existing steps may be removed, modified or rearranged without departing from the scopes of the methods 400 and 450.

At step 402, the air moving devices 114a–114n may be set to a setpoint temperature ($T_{SET}$) and a setpoint flow rate ($FR_{SET}$). The setpoint temperature may determine the operating status of the temperature actuators 230. Thus, for instance, a lower setpoint temperature may cause the temperature actuators 230 to operate at a relatively higher level to thereby reduce the supply airflow temperature. Likewise, the setpoint flow rate may determine the operating status of the airflow rate actuators 232, with a higher setpoint flow rate causing the airflow rate actuators 232 to operate at a higher level to thereby increase the rate at which airflow is supplied by the air moving devices 114a–114n.

The setpoint temperature and the setpoint flow rate of the air moving devices 114a–114n may initially be set, for instance, according to predetermined values, such as those determined through modeling or testing of the airflow characteristics of the data center 100. Alternatively, however, the setpoint temperature and the setpoint flow rate may be relatively arbitrarily set as the setpoints may be changed through operation of the method 400.

In any regard, at step 404, a period of time, such as, a few seconds, a few minutes, etc., may be allowed to elapse. The amount of time allowed to elapse may be determined through testing, for instance, to determine when a substantially steady set of conditions is reached following activation or changes in operating levels of the air moving devices 114a–114n. Alternatively, however, the waiting period may be relatively arbitrarily set so long as a sufficient amount of time is allowed to elapse to generally enable the air moving device 114a–114n changes to be detectable.

Following the waiting period at step 404, the temperatures detected at the inlets ($T_i$) of the racks 102a–102n may be received by the controller 130. More particularly, for instance, the sensors 120a–120n may detect the temperatures of the airflow supplied into one or more of the racks 102a–102n and may transmit the detected temperature information to the controller 130 as described above with respect to FIG. 2.

At step 408, the controller 130 may determine whether any of the received inlet temperatures exceeds a predetermined maximum temperature ($T_{MAX}$). The predetermined maximum temperature may comprise the upper bound of the second predetermined temperature range discussed above with respect to FIG. 3. In addition, the predetermined maximum temperature may comprise a temperature below a maximum allowed temperature for the electronic components 116. The predetermined maximum temperature may also be determined based upon one or more of the server manufacturer specifications, data center operator/manager requests, energy savings, available data center cooling capacity, etc.

If none of the inlet temperatures exceeds the predetermined maximum temperature, the controller 130 may determine whether any of the inlet temperatures fall below a predetermined minimum temperature ($T_{MIN}$), at step 410.

The predetermined minimum temperature ($T_{MIN}$) may comprise the lower bound of the second predetermined temperature range discussed above with respect to FIG. 3. In addition, the predetermined minimum temperature may be determined based upon one or more of, for instance, the server manufacturer specifications, data center operator/manager requests, energy savings, available data center cooling capacity, etc.

If, however, at least one of the inlet temperatures exceeds the predetermined maximum temperature, the controller 130 may determine whether the inlet temperature(s) that exceeds the predetermined maximum temperature ($T_{i,MAX}$) also exceeds the predetermined maximum temperature ($T_{MAX}$) plus a pre-specified value (J), at step 412. The predetermined maximum temperature plus the pre-specified value ($T_{MAX+J}$) may correspond to the upper bound of the first predetermined temperature range discussed above with respect to FIG. 3. In addition, the pre-specified value may be set based upon various criteria. For instance, the pre-specified value (J) may be set according to one or more of the temperature time constant, the data center controller response time, response times of the air moving devices 114a–114n, communication latency, server manufacturer specifications, temperature sensor accuracy and control stability, etc.

If the controller 130 determines that the inlet temperature(s) that exceeded the predetermined maximum temperature ($T_{i,MAX}$) exceeds the predetermined maximum temperature plus the pre-specified value ($T_{MAX+J}$), the controller 130 may control the air moving devices 114a–114n, and more particularly, the temperature actuators 230, to decrease their set point temperatures ($T_{SET}$), by a preset amount, at step 414. The preset amount may be set according to a variety of factors. For instance, the present amount may be relatively arbitrarily set to a few degrees, such that an iterative process of detecting temperatures and decreasing the setpoint temperatures may be performed to bring the airflow supply temperatures to desired levels. In any regard, following the setpoint temperature decrease, the controller 130 may again wait at step 404 prior to receiving the inlet temperatures at step 406.

If, however, the controller 130 determines that the inlet temperature(s) that exceeded the predetermined maximum temperature ($T_{i,MAX}$) does not exceed the predetermined maximum temperature plus the pre-specified value ($T_{MAX+J}$), the controller 130 may determine whether operations of the air moving devices 114a–114n are to be varied, at step 416. In other words, when the "no" condition is reached at step 412, the controller 130 has determined that the inlet temperature(s) fall within the first predetermined temperature range and the second predetermined temperature range, as discussed above with respect to FIG. 3.

At step 416, more particularly, the controller 130 may determine whether the flow rate(s) at the location(s) where the $T_{i,MAX}$ was detected ($FR_{ZONE}$) has reached or a exceeded a predetermined flow rate maximum value ($FR_{ZONE,MAX}$). The predetermined flow rate maximum value may have been reached or exceeded if the airflow rate actuator(s) 232 that are within a zone of the $T_{i,MAX}$ location is operating at or above its rated maximum capacity. As described above, an air moving device 114a may be considered as being within a zone of a sensor 120a, or vice versa, for instance, when they are within a predetermined distance with respect to each other. As another example, an air moving device 114a may be considered as being within a zone of a sensor 120a if they are determined to be associated with each other during a commissioning process as described above.

If the controller 130 determines that the flow rate ($FR_{ZONE}$) at the location where the $T_{i,MAX}$ was detected does equal or exceed the predetermined flow rate maximum value ($FR_{ZONE,MAX}$), the controller 130 may control the air moving devices 114a–114n, and more particularly, the temperature actuators 230, to decrease their set point temperatures ($T_{SET}$), by a preset amount, at step 414. If, however, the controller 130 determines that the flow rate ($FR_{ZONE}$) at the location where the $T_{i,MAX}$ was detected falls below the predetermined flow rate maximum value ($FR_{ZONE,MAX}$), the controller 130 may control the air moving devices 114a–114n, and more particularly, the airflow rate actuators 232, to increase the flow rate of airflow supplied to the location where the $T_{i,MAX}$ was detected by a preset percentage (X %), at step 418. The preset percentage (X %) may be set according to a variety of factors. For instance, the present percentage (X %) may be relatively arbitrarily set to a few percentage points, such that an iterative process of detecting temperatures and increasing the airflow supply rates may be performed to bring the airflow supply rates to desired levels. Following either of steps 414 and 418, the controller 130 may again wait at step 404 prior to receiving the inlet temperatures at step 406.

Turning back to step 410, if the controller 130 determines that none of the inlet temperatures ($T_i$) falls below the predetermined minimum temperature ($T_{MIN}$), the controller 130 may wait a period of time at step 404 and may repeat steps 408 and 410 in a substantially iterative manner. In one regard, the "no" condition at step 410 generally indicates that none of the temperatures are outside of the first predetermined temperature range.

If, however, the controller 130 determines that at least one of the inlet temperatures ($T_i$) falls below the predetermined minimum temperature ($T_{MIN}$), the controller 130 may determine whether the inlet temperature(s) that fall below the predetermined minimum temperature ($T_{i,MIN}$) also falls below the predetermined minimum temperature ($T_{MIN}$) minus a pre-specified value (K), at step 420. The predetermined minimum temperature minus the pre-specified value ($T_{MIN-K}$) may correspond to the lower bound of the first predetermined temperature range discussed above with respect to FIG. 3. In addition, the pre-specified value may be set based upon various criteria. For instance, the pre-specified value (K) may be set according to one or more of the temperature time constant, the data center controller response time, response times of the air moving devices 114a–114n, communication latency, server manufacturer specifications, temperature sensor accuracy and control stability, etc.

If the controller 130 determines that the inlet temperature(s) that fell below the predetermined minimum temperature ($T_{i,MIN}$) also falls below the predetermined minimum temperature minus the pre-specified value ($T_{MIN-K}$), the controller 130 may control the air moving devices 114a–114n, and more particularly, the temperature actuators 230, to increase their setpoint temperatures ($T_{SET}$), by a preset amount, at step 422. The preset amount may be set according to a variety of factors. For instance, the preset amount may be relatively arbitrarily set to a few degrees, such that an iterative process of detecting temperatures and increasing the setpoint temperatures may be performed to bring the airflow supply temperatures to desired levels. In any regard, following the setpoint temperature increase, the controller 130 may again wait at step 404 prior to receiving the inlet temperatures at step 406.

If, however, the controller 130 determines that the inlet temperature(s) that fell below the predetermined minimum temperature ($T_{i,MIN}$) exceeds the predetermined minimum temperature minus the pre-specified value ($T_{MIN-K}$), the controller 130 may determine whether operations of the air moving devices 114a–114n are to be varied, at step 424. In other words, when the "no" condition is reached at step 420, the controller 130 has determined that the inlet temperature (s) fall within the first predetermined temperature range and the second predetermined temperature range, as discussed above with respect to FIG. 3.

At step 424, more particularly, the controller 130 may determine whether the flow rate(s) at the location(s) where the $T_{i,MIN}$ was detected ($FR_{ZONE}$) has reached or has fallen below a predetermined flow rate minimum value ($FR_{ZONE,MIN}$). The predetermined flow rate minimum value may have been reached or exceeded if the airflow rate actuator(s) 232 that are within a zone of the $T_{i,MAX}$ location is operating at or below rated levels. The airflow rate actuator(s) 232 may be considered as operating at or below rated levels when, for instance, their operating levels are sufficiently low such that appropriate or desired levels of airflow are not being delivered to one or more locations in the data center 100.

As described above, an air moving device 114a may be considered as being within a zone of a sensor 120a, or vice versa, for instance, when they are within a predetermined distance with respect to each other. As another example, an air moving device 114a may be considered as being within a zone of a sensor 120a if they are determined to be associated with each other during a commissioning process as described above.

If the controller 130 determines that the flow rate ($FR_{ZONE}$) at the location where the $T_{i,MIN}$ was detected does equal or fall below the predetermined flow rate minimum value ($FR_{ZONE,MIN}$), the controller 130 may control the air moving devices 114a–114n, and more particularly, the temperature actuators 230, to increase their set point temperatures ($T_{SET}$), by a preset amount, at step 422. If, however, the controller 130 determines that the flow rate ($FR_{ZONE}$) at the location where the $T_{i,MIN}$ was detected exceeds the predetermined flow rate minimum value ($FR_{ZONE,MIN}$), the controller 130 may control the air moving devices 114a–114n, and more particularly, the airflow rate actuators 232, to decrease the flow rate of airflow supplied to the location where the $T_{i,MIN}$ was detected by a preset percentage (X %), at step 426. The preset percentage (X %) may be set according to a variety of factors. For instance, the preset percentage (X %) may be relatively arbitrarily set to a few percentage points, such that an iterative process of detecting temperatures and decreasing the airflow supply rates may be performed to bring the airflow supply rates to desired levels. Following either of steps 422 and 426, the controller 130 may again wait at step 404 prior to receiving the inlet temperatures at step 406.

Figure 4A:
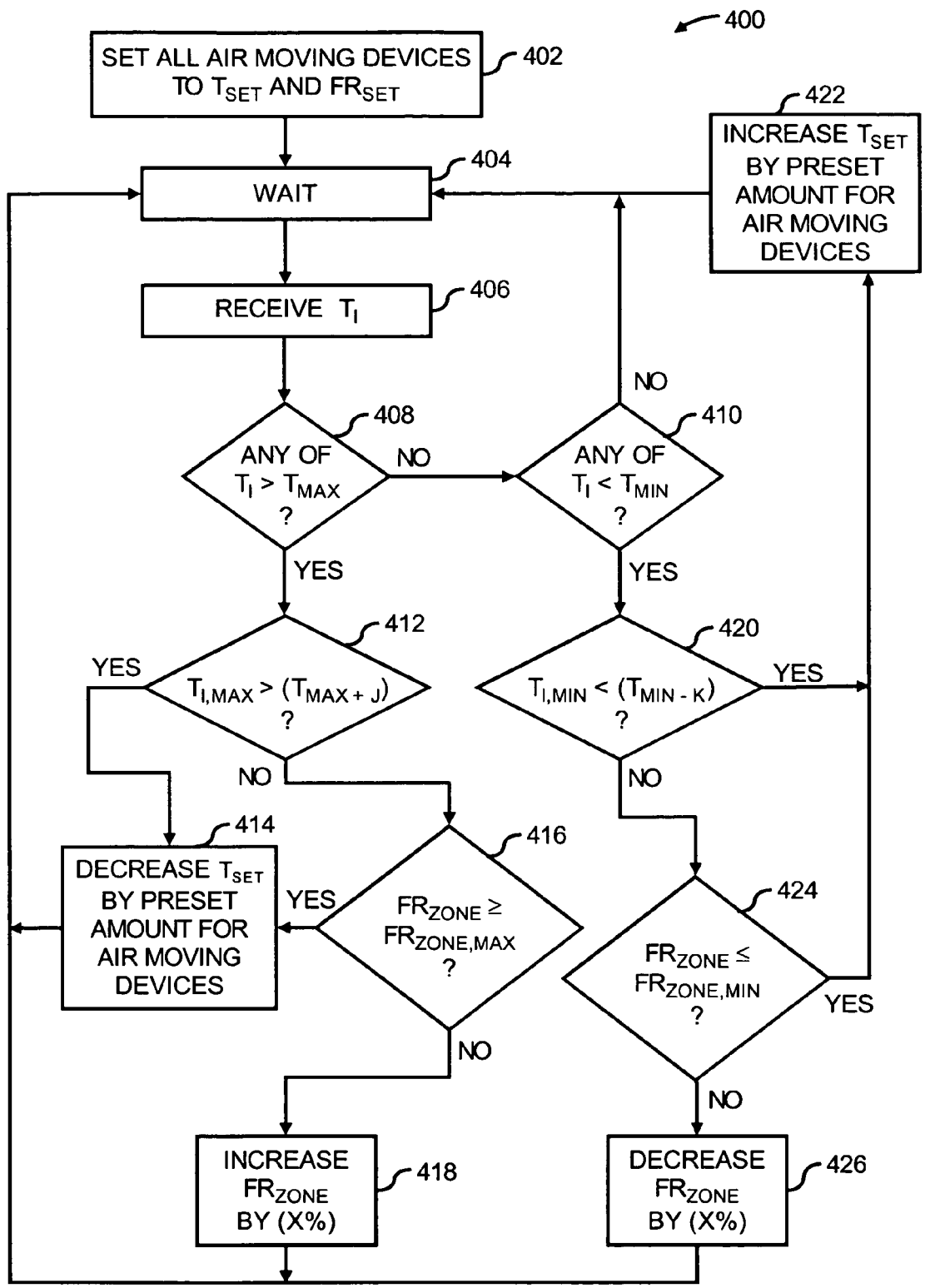
FIG. 4A illustrates a flow diagram of a method for thermally managing a room, which illustrates in greater detail the method of FIG. 3, according to an embodiment of the invention.
Figure 4B:
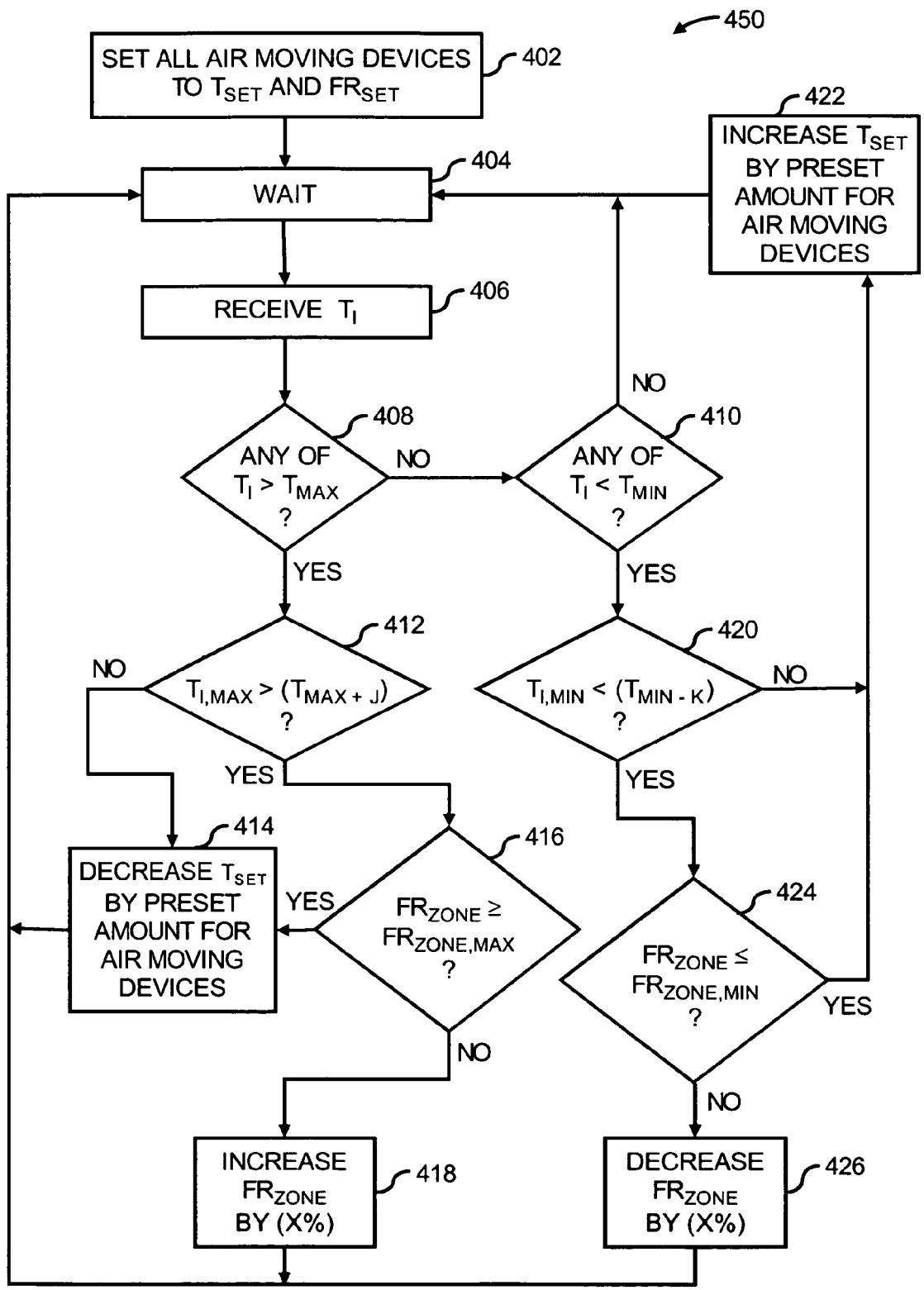
FIG. 4B illustrates a flow diagram of a method for thermally managing a room, which illustrates in greater detail the method of FIG. 3, according to another embodiment of the invention.

Turning now to FIG. 4B, there is shown a method 450 for thermally managing a room comprising all of the steps depicted in the method 400 of FIG. 4A. In comparing FIGS. 4A and 4B, the only differences lie in the "yes" and "no" conditions of steps 412 and 420. As such, in the method 450, when inlet temperature(s) exceeds the predetermined maximum temperature ($T_{MAX}$) plus a pre-specified value (J), which is the upper bound of first predetermined temperature range, the setpoint flow rate for the airflow rate actuator 232 may be increased by a present percentage (X %), as indicated at step 418. In addition, step 416 may also be performed to generally ensure that the flow rates for the zones in the data center 100 do not exceed the predetermined flow rate maximum value ($FR_{ZONE,MAX}$).

At step 412 in FIG. 4B, if the inlet temperature(s) falls between an upper bound of the second predetermined maximum temperature and an upper bound of the first predetermined maximum temperature, then the setpoint temperature for the temperature actuator 230 is decreased by a preset amount, as indicated at step 414. Step 414 may also be performed in response to a "yes" condition at step 416.

Likewise, at step 420, when the inlet temperature(s) falls below a lower bound of the first predetermined minimum temperature, the setpoint flow rate for the airflow rate actuator 232 may be decreased by a present percentage (X %), as indicated at step 426. In addition, step 424 may also be performed to generally ensure that the flow rates for the zones in the data center 100 do not fall below the predetermined flow rate minimum value ($FR_{ZONE,MIN}$).

At step 420 in FIG. 4B, if the inlet temperature(s) falls between a lower bound of the second predetermined minimum temperature and a lower bound of the first predetermined minimum temperature, then the setpoint temperature for the temperature actuator 230 is increased by a preset amount, as indicated at step 422. Step 422 may also be performed in response to a "yes" condition at step 424.

Either or both of the methods 400 and 450 may be performed on a substantially continuous basis to thereby thermally manage the data center 100 in a relatively energy efficient manner.

The operations set forth in the methods 300, 400, and 450 may be contained as a utility, program, or subprogram, in any desired computer accessible medium. In addition, the methods 300, 400, and 450 may be embodied by a computer program, which can exist in a variety of forms both active and inactive. For example, it can exist as software program (s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
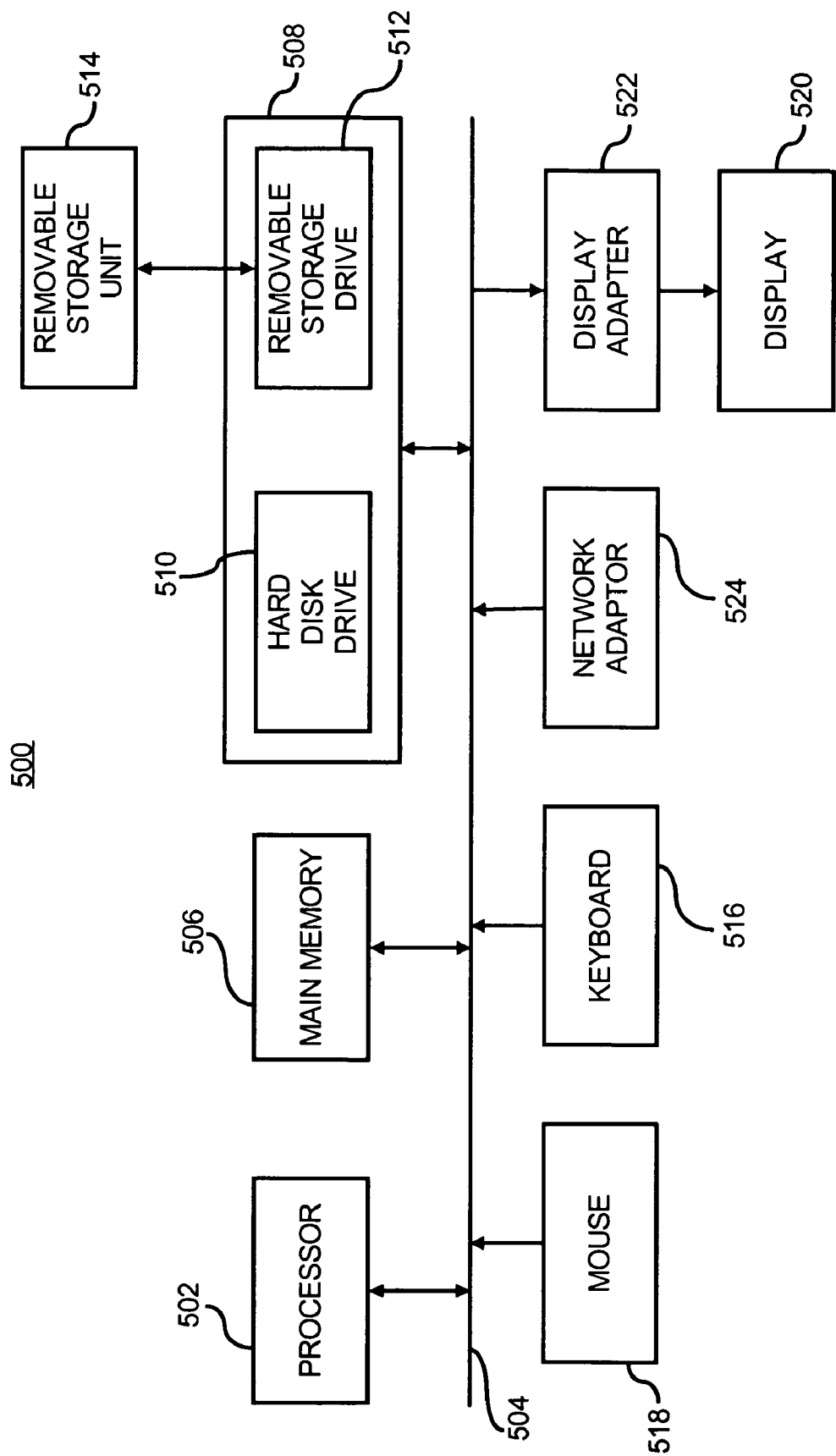
FIG. 5 illustrates a computer system, which may be employed to perform the various functions of the thermal management system depicted in FIG. 2, according to an embodiment of the invention.

FIG. 5 illustrates a computer system 500, which may be employed to perform the various functions of the controller 130 described hereinabove, according to an embodiment. In this respect, the computer system 500 may be used as a platform for executing one or more of the functions described hereinabove with respect to the controller 130.

The computer system 500 includes one or more controllers, such as a processor 502. The processor 502 may be used to execute some or all of the steps described in the methods 300, 400, and 450. Commands and data from the processor 502 are communicated over a communication bus 504. The computer system 500 also includes a main memory 506, such as a random access memory (RAM), where the program code for, for instance, the controller 130, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the thermal management system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for thermally managing a room with at least one air moving device having a temperature actuator and an airflow rate actuator, said method comprising:
   receiving a temperature of airflow at a first location in the room;
   comparing the received temperature with a first predetermined temperature range and a second predetermined temperature range, wherein the first predetermined temperature range is outside of the second predetermined temperature range;
   varying one of the temperature actuator and the airflow rate actuator when the received temperature of the airflow is outside of the first predetermined temperature range; and
   varying the other of the temperature actuator and the airflow rate actuator when the received temperature of the airflow is within the first predetermined temperature range and outside of the second predetermined temperature range.

2. The method according to claim 1, further comprising:
   determining which of the temperature actuator and the airflow rate actuator is associated with higher costs; and
   wherein varying one of the temperature actuator and the airflow rate actuator when the received temperature of the airflow is outside of the first predetermined temperature range further comprises varying the one of the temperature actuator and the airflow rate actuator associated with the higher costs.

3. The method according to claim 1, further comprising:
   receiving temperatures of airflows from a plurality of locations in the room;
   wherein comparing the received temperature further comprises comparing the received temperatures with the first predetermined temperature range and the second predetermined temperature range;
   wherein varying one of the temperature actuator and the airflow rate actuator further comprises varying the temperature actuator to vary the temperature of airflow supplied from the at least one air moving device when at least one of the received temperatures is outside of the first predetermined temperature range; and
   wherein varying the other of the temperature actuator and the airflow rate actuator further comprises varying the airflow rate actuator to vary the flow rate of airflow supplied from the at least one air moving device when at least one of the received temperatures is within the first predetermined temperature range and outside of the second predetermined temperature range.

4. The method according to claim 3, further comprising:
   determining whether the flow rate of airflow supplied by the at least one air moving device is equal to or exceeds a predetermined flow rate maximum value for the at least one air moving device in response to the at least one of the received temperatures falling below an upper bound of the first predetermined temperature range;
   decreasing a temperature setpoint of the at least one air moving device from a first temperature setpoint by a preset amount in response to the flow rate of airflow supplied by the at least one air moving device being equal to or exceeding the predetermined flow rate maximum value; and
   wherein varying the airflow rate actuator further comprises varying the airflow rate actuator to increase the flow rate of airflow supplied from the at least one air moving device in response to the flow rate of airflow supplied by the at least one air moving device falling below the predetermined flow rate maximum value.

5. The method according to claim 4, wherein the room comprises a plurality of air moving devices, said method further comprising:
   determining zones for the plurality of air moving devices;
   determining in which air moving device zone the at least one of the received temperatures that fell below the predetermined flow rate maximum value is located; and
   wherein varying the airflow rate actuator to increase the flow rate of airflow further comprises varying the airflow rate actuator to increase the flow rate of airflow supplied from the at least one air moving device corresponding to the determined air moving device zone by a preset amount.

6. The method according to claim 3, wherein varying the temperature actuator further comprises varying the temperature actuator to increase a temperature setpoint of the at least one air moving device from a first temperature setpoint by a preset amount in response to the at least one of the received temperatures falling below a lower bound of the first predetermined temperature range.

7. The method according to claim 3, further comprising:
   determining whether the flow rate of airflow supplied by the at least one air moving device is equal to or falls below a predetermined flow rate minimum value for the at least one air moving device in response to the at least one of the received temperatures exceeding a lower bound of the first predetermined temperature range;
   increasing a temperature setpoint of the at least one air moving device from the first temperature setpoint by a preset amount in response to the flow rate of airflow supplied by the at least one air moving device being equal to or falling below the predetermined flow rate minimum value; and wherein varying the airflow rate actuator further comprises varying the airflow rate actuator to decrease the flow rate of airflow supplied from the at least one air moving device in response to the flow rate of airflow supplied by the at least one air moving device exceeding the predetermined flow rate minimum value.

8. The method according to claim 7, wherein the room comprises a plurality of air moving devices, said method further comprising:
   determining zones for the plurality of air moving devices;
   determining in which air moving device zone the at least one of the received temperatures that exceeded the predetermined flow rate minimum value is located; and
   wherein varying the airflow rate actuator to decrease the flow rate of airflow further comprises varying the airflow rate actuator to decrease the flow rate of airflow supplied from the at least one air moving device corresponding to the determined air moving device zone by a preset amount.

9. The method according to claim 1, further comprising:
   receiving temperatures of airflows from a plurality of locations in the room;
   wherein comparing the received temperature further comprises comparing the received temperatures with the first predetermined temperature range and the second predetermined temperature range;
   wherein varying one of the temperature actuator and the airflow rate actuator further comprises varying the airflow rate actuator to vary the rate of airflow supplied from the at least one air moving device when at least one of the received temperatures is outside of the first predetermined temperature range; and
   wherein varying the other of the temperature actuator and the airflow rate actuator further comprises varying the temperature actuator to vary the temperature of the airflow supplied by the at least one air moving device when at least one of the received temperatures is within the first predetermined temperature range and outside of the second predetermined temperature range.

10. The method according to claim 9, further comprising:
    determining whether the flow rate of airflow supplied by the at least one air moving device is equal to or exceeds a predetermined flow rate maximum value for the at least one air moving device in response to the at least one of the received temperatures exceeding an upper bound of the first predetermined temperature range;
    decreasing a temperature setpoint of the at least one air moving device from a first temperature setpoint by a preset amount in response to the flow rate of airflow supplied by the at least one air moving device being equal to or exceeding the predetermined flow rate maximum value; and
    wherein varying the airflow rate actuator further comprises varying the airflow rate actuator to increase the flow rate of airflow supplied from the at least one air moving device in response to the flow rate of airflow supplied by the at least one air moving device falling below the predetermined flow rate maximum value.

11. The method according to claim 10, wherein the room comprises a plurality of air moving devices, said method further comprising:
    determining zones for the plurality of air moving devices;
    determining in which air moving device zone the at least one of the received temperatures that fell below the predetermined flow rate maximum value is located; and
    wherein varying the airflow rate actuator to increase the flow rate of airflow further comprises varying the airflow rate actuator to increase the flow rate of airflow supplied from the at least one air moving device corresponding to the determined air moving device zone by a preset amount.

12. The method according to claim 9, further comprising:
    determining whether the flow rate of airflow supplied by the at least one air moving device is equal to or falls below a predetermined flow rate minimum value for the at least one air moving device in response to the at least one of the received temperatures exceeding a lower bound of the first predetermined temperature range;
    increasing a temperature setpoint of the at least one air moving device from a first temperature setpoint by a preset amount in response to the flow rate of airflow supplied by the at least one air moving device being exceeding the predetermined flow rate minimum value; and
    wherein varying the airflow rate actuator further comprises varying the airflow rate actuator to decrease the flow rate of airflow supplied from the at least one air moving device in response to the flow rate of airflow supplied by the at least one air moving device exceeding the predetermined flow rate minimum value.

13. The method according to claim 12, wherein the room comprises a plurality of air moving devices, said method further comprising:
    determining zones for the plurality of air moving devices;
    determining in which air moving device zone the at least one of the received temperatures that exceeded the predetermined flow rate minimum value is located; and
    wherein varying the airflow rate actuator to decrease the flow rate of airflow further comprises varying the airflow rate actuator to decrease the flow rate of airflow supplied from the at least one air moving device corresponding to the determined air moving device zone by a preset amount.

14. A system for thermally managing a room, said system comprising:
    an air moving device having a temperature actuator and an airflow rate actuator, the temperature actuator having a temperature setpoint and the airflow rate actuator having a flow rate setpoint;
    at least one sensor positioned at various location in the room, said at least one sensor being configured to take temperature measurements; and
    a controller configured to receive the temperature measurements from the at least one sensor and to control the air moving device, wherein the controller is configured to vary the setpoint for one of the temperature actuator and the airflow rate actuator when the at least one temperature measurement exceeds a first predetermined temperature range and to vary the setpoint for the other of the temperature actuator and the airflow rate actuator when the at least one temperature measurement falls between a second predetermined temperature range and the first predetermined temperature range, wherein the first predetermined temperature range is outside of the second predetermined temperature range.

15. The system according to claim 14, wherein the controller is further configured to determine which of the temperature actuator and the airflow rate actuator is associated with higher costs, and wherein the controller is further configured to vary the setpoint for the one of the temperature actuator and the airflow rate actuator being associated with the higher costs when the at least one temperature measurement falls outside of a first predetermined temperature range.

16. The system according to claim 14, wherein the controller is further configured to decrease the temperature setpoint for the temperature actuator when the at least one temperature measurement exceeds an upper bound of the first predetermined temperature range and to increase the temperature setpoint for the temperature actuator when the at least one temperature measurement falls below a lower bound of the first predetermined temperature range.

17. The system according to claim 14, wherein the controller is further configured to increase the flow rate setpoint for the airflow rate actuator when the at least one temperature measurement falls between an upper bound of the second predetermined temperature range and an upper bound of the first predetermined temperature range and to decrease the flow rate setpoint for the airflow rate actuator when the at least one temperature measurement falls between a lower bound of the second predetermined temperature range and a lower bound of the first predetermined temperature range.

18. The system according to claim 14, wherein the controller is further configured to increase the flow rate setpoint for the airflow rate actuator when the at least one temperature measurement exceeds an upper bound of the first predetermined temperature range and to decrease the temperature setpoint for the temperature actuator when the at least one temperature measurement falls below a lower bound of the first predetermined temperature range.

19. The system according to claim 14, wherein the controller is further configured to decrease the temperature setpoint for the temperature actuator when the at least one temperature measurement falls between an upper bound of the second predetermined temperature range and an upper bound of the first predetermined temperature range and to increase the temperature setpoint for the temperature actuator when the at least one temperature measurement falls between a lower bound of the second predetermined temperature range and a lower bound of the first predetermined temperature range.

20. A computer readable storage medium on which is embedded one or more computer programs, said one or more computer programs implementing a method for thermally managing a room with an air moving device having a temperature actuator and an airflow rate actuator, said one or more computer programs comprising a set of instructions for:

determining which of the temperature actuator and the airflow rate actuator is associated with higher costs;

receiving temperatures of airflows from at least one location in the room;

comparing the received temperature with a first predetermined temperature range and a second predetermined temperature range, wherein the first predetermined temperature range is outside of the second predetermined temperature range;

varying the one of the temperature actuator and the airflow rate actuator associated with the higher costs when the received temperature of the airflow is outside of the first predetermined temperature range; and varying the other of the first actuator and the second actuator when the received temperature of the airflow falls between the first predetermined temperature range and the second predetermined temperature range.

* * * * *